United States Patent [19]

Kariyama

[11] Patent Number: 5,510,643
[45] Date of Patent: Apr. 23, 1996

[54] HIGH VOLTAGE MOS TRANSISTOR

[75] Inventor: Masaru Kariyama, Nara, Japan

[73] Assignee: Sharp Kabushiki Kaisha, Osaka, Japan

[21] Appl. No.: 149,109

[22] Filed: Nov. 9, 1993

[30] Foreign Application Priority Data

Jan. 6, 1993 [JP] Japan .................... 5-000452

[51] Int. Cl.$^6$ ............................. H01L 27/092
[52] U.S. Cl. .................. 257/409; 257/369; 257/408
[58] Field of Search .................... 257/409, 408, 257/369

[56] References Cited

U.S. PATENT DOCUMENTS 4,819,045  4/1989  Murakami .................. 257/409
4,990,982  2/1991  Omoto et al. ............... 257/409

FOREIGN PATENT DOCUMENTS 60-47456  3/1985  Japan .

*Primary Examiner*—William D. Larkins
*Attorney, Agent, or Firm*—Nixon & Vanderhye

[57] ABSTRACT

A semiconductor device having a high voltage MOS transistor comprise a first conductivity type semiconductor substrate; a second conductivity type tub formed in the first conductivity type semiconductor substrate; first conductivity type source/drain regions formed in the second conductivity type tub; and first conductivity type drift layers connected with either of the first conductivity type source/drain regions; wherein the second conductivity type tub has slit portions having a low impurity concentration in the neighborhood of the first conductivity type drift layer, whose impurity concentration is at the same level to that of the inside of the second conductivity type tub.

9 Claims, 5 Drawing Sheets

POSITION OF THE SLIT PORTION

HIGH VOLTAGE MOS TRANSISTOR

BACKGROUND OF THE INVENTION

1. Field of the Invention

The present invention relates to a semiconductor device having a high dielectric strength MOS transistor.

2. Description of the Prior Art

Some conventional semiconductor devices include a semiconductor substrate having a tub of conductivity type different from the counterpart of the semiconductor substrate, the tub formed within the semiconductor substrate. In the tub, a drift layer is formed which has the same conductive type as the semiconductor substrate. An embodiment of such conventional semiconductor device is a P-type high dielectric strength MOS transistor is shown in FIG. 7.

FIG. 7 is a view illustrating a general construction of the semiconductor device. As a semiconductor substrate, a P-type silicon substrate 1 is used. This p-type silicon substrate 1 defines an active region by forming a select oxide film 11 comprising $SiO_2$ on the silicon substrate 1. On this active region is formed a gate oxide film 13 comprising $SiO_2$. On the gate oxide film 13 is further formed a gate electrode 14 formed of polysilicon. Further within this silicon substrate 1 is formed a tub 35 constituting a $n^-$ type impurity diffusion layer. Within this tub 35 below the select oxide film 11 is formed drift layers 12 constituting a P-type impurity diffusion layer. Further within this tub 35 and on the surface of the silicon substrate 1 is formed source/drain regions 15 and 16, the drain region 16 is connected to the drift layers 12. The concentration of impurity in the tub 35 gradually decreases from the surface of the silicon substrate 1 to the inside thereof. Reference Numeral 36 designates an isoline connecting the points of the same impurity concentration inside the tub. On the other hand, on the silicon substrate 1 including the gate electrode 14 is laminated a CVD $SiO_2$ film 17. On this CVD $SiO_2$ film 17 is formed a contact hole extending through to the silicon substrate 1. Through this contact hole, a source electrode 18 and a drain electrode 19 are formed each connected to the source/drain regions 15 and 16.

In the above semiconductor device, an electric field is generated between the drift layers 12 and the tub 35. Then the strength of this electric field determines the reverse dielectric strength. To raise the reverse dielectric strength, it is necessary to lower the impurity concentration of the tub 35.

FIG. 6 shows a relationship between the reverse dielectric strength and the impurity concentration of the tub 35. FIG. 6 shows that the reverse dielectric strength decreases along with an increase in the impurity concentration of the tub 35.

However, lowering the impurity concentration or the tub 35 in order to raise the reverse dielectric strength generates the following drawback in the above semiconductor device.

One drawback is that current flows between the source/drain regions 15 and 16 even if the channel is not formed between them, and a punch-through is liable to occur. When punch-through is liable to occur, the gate length (X in FIG. 7) which corresponds to the distance between the drain and source is increased. Thus the size of the transistors becomes larger.

Another drawback is that when a low voltage driving transistor is provided along with the high dielectric strength MOS transistor on the same silicon substrate 1, the tub for forming the low voltage driving transistor and the tub 35 for forming the high dielectric strength MOS transistor have different impurity concentration. Consequently these two tubs must be formed separately, and the process for preparing them becomes more complicated.

SUMMARY OF THE INVENTION

The object of the invention is to provide a semiconductor device in which a small-size high voltage MOS transistor can be prepared in a simple method.

Therefore the present invention provides a semiconductor device having a high dielectric strength MOS transistor comprising: a first conductivity type semiconductor substrate; a second conductivity type tub formed in the first conductivity type semiconductor substrate; first conductivity type source/drain regions formed in the second conductive type tub; and first conductivity type drift layers connected with either of the first conductivity type source/drain regions; wherein the second conductive type tub has slit portions having a low impurity concentration in the neighborhood or vicinity of the first conductivity type drift layer, and wherein the impurity concentration of the slit portions is at the same level as that of the inside of the second conductivity type tub.

BRIEF DESCRIPTION OF THE DRAWINGS

The present invention will be fully understood from the detailed description given hereinbelow and the accompanying drawings which are given by way of illustration in which.

DETAILED DESCRIPTION OF THE PREFERRED EMBODIMENT

Preferably the present invention uses a silicon substrate as a semiconductor substrate. Both p-type and n-type conductivity type semiconductor substrates operate substantially in the same manner and can be used for both p-type high dielectric MOS transistors and n-type high dielectric strength MOS transistors. In the semiconductor substrate, a second conductivity type tub including impurities of a conductivity type different from the counterpart of the semiconductor substrate (first conductivity type) is formed.

The second conductivity type tub according to the present invention can be formed by implanting p-type impurities like boron or the like and n-type impurities like phosphorus or arsenic in a concentration of about $5 \times 10^{12}$ to $1 \times 10^{13}$ ions/cm$^2$ at about 60 to 150 KeV followed by thermal treating for about 1000 to 2000 minutes at about 1100 to 1200° C. A concentration of impurities contained in the second conductivity type tub is relatively high assuming about $1 \times 10^{16}$ to $3 \times 10^{16}$ ions/cm$^3$ in the neighborhood of the surface of the substrate. On the other hand, a concentration of impurities is relatively low assuming about $7 \times 10^{15}$ to $9 \times 10^{15}$ ions/cm$^3$ in the neighborhood of iso lines inside of the tub. The depth and size of the second conductivity type tub can be appropriately selected depending on the size of the semiconductor device or the like. Preferably the depth of the second conductivity type tub is about 5 to 7 µm.

In accordance with the present invention, the first conductivity type source/drain regions formed in the second conductivity type tub can be formed by implanting impurities such as boron, phosphorus, arsenic or the like in a concentration of about $2-5 \times 10^{15}$ ions/cm$^2$ at about 10 to 80 KeV followed by thermal treating for about 50 to 100 minutes at about 800° to 900° C.

In addition, the first conductive drift layers formed in the second conductivity type tub can be formed by implanting impurities such as boron, phosphorus, arsenic or the like in a concentration of about $1 \times 10^{13}$ to $1 \times 10^{14}$ ions/cm$^2$ at about 10 to 50 KeV followed by thermal treating for about 300 to 500 minutes at by about 900° to 1100° C. The first conductivity type drift layers are formed below the device isolation region and may be connected with either of the first conductivity type source/drain regions. In this case, one drift layer may be connected with an edge of either source or drain region of the first conductivity type, or two drift layers may be connected with either source or drain region of the first conductivity type so that they are arranged approximately opposite to each other with the first conductivity type source/drain region.

Figure 5A:
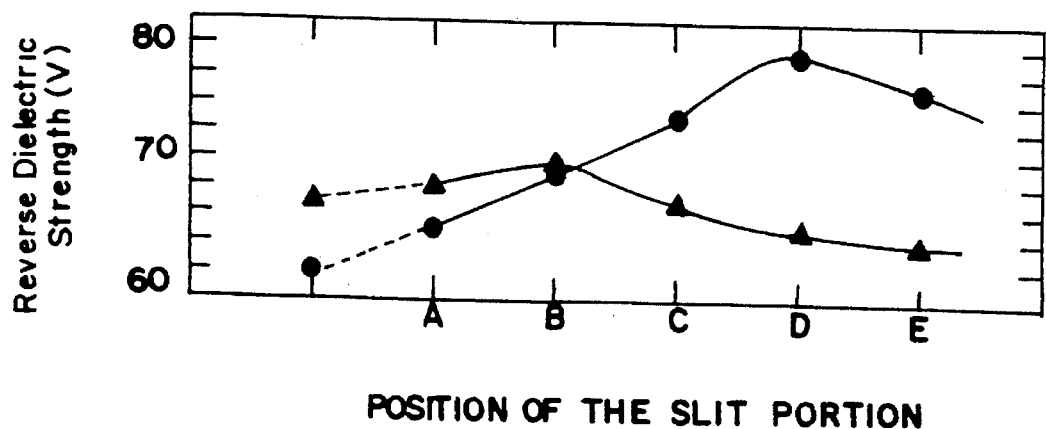
FIGS. 5(a) and (b) illustrate the position dependency of the low concentration portion (slit portion within the second conductivity type tub with respect to the reverse dielectric strength properties of the semiconductor device according to the above embodiment.
Figure 5B:
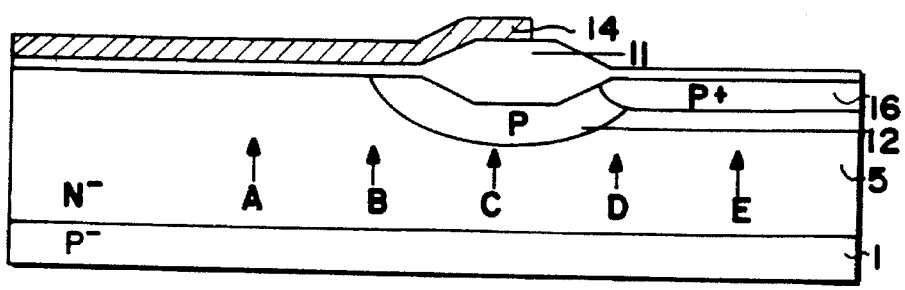

Furthermore on the substrate surface of the second conductivity type tub and in the neighborhood of the drift layer is formed a low concentration impurity region (slit portion) where the concentration of impurities of slit portions are approximately equal in part to the iso line region interiorly of the tub. The area of the partial low concentration region, namely the size of the slit portions depends on the size of the semiconductor device. Preferably the width ranges about 1 to 4 µm. In addition, it is also preferable to form the slit portions at a position where strong electric field is generated in the neighborhood of the drift layer upon the application of a high voltage applied to the drain electrode. The position where the strong electric field is generated serves as a connecting portion between the source/drain region and the drift layer when the impurity concentration in the drift layer is in the portion of the range lower 2 to $8 \times 10^{16}$ ions/cm$^3$, i.e. $2 \times 10^{16}$ to $5 \times 10^{16}$ ions/cm$^3$. The same portion also serves as an end of the drift layer located opposite to the source/drain region when the impurity concentration in the drift layer is in the higher portion of the range 2 to $8 \times 10^{16}$ ions/cm$^3$ i.e. $5 \times 10^{16}$ to $8 \times 10^{16}$ ions/cm$^3$. This is set by the relations between the height of the reverse dielectric strength and the position of the slit portions. FIG. 5 shows the result of the reverse dielectric strength measured by changing the slit position assuming the position (A) to (E) when the impurity concentration in the P-type drift layer is low assuming less than $5 \times 10^{16}$ ions/cm$^3$ (designated by (●) in FIG. 5), i.e., $4 \times 10^{16}$ ions/cm$^3$ and when the impurity concentration in the same is high assuming more than $5 \times 1016/$ cm$^3$ (designated by (▲) in FIG. 5), i.e., $6 \times 10^{16}$ ions/cm$^3$. In this result, when the concentration in the drift layer is low (●), the reverse dielectric strength assumes the highest value when slit portions are arranged at a connecting portion (D) between the drain diffusion layer and the drift layer. On the other hand, when the impurity concentration in the drift layer is high f(▲), the reverse dielectric strength assumes the highest value when the slit portions are arranged at the portion (B) which is an end of the drift layer opposite to the region connected to the source/drain region. Compared with the case where there are no slit portions in the second conductivity type tub, the reverse dielectric strength has improved by about 18 V. Consequently, the low concentration region (slit portion) is formed in the neighborhood of the connecting portion between the source/drain region and the drift layer, or the neighborhood of the end of the drift layer opposite to the region connected to the source/drain region.

The slit portions corresponding to the low concentration portion within the second conductivity type tub can be formed, for example, in the following method. One such method involves implanting the second conductivity type impurities by use of a photoresist to mask the formation region of the tub in order to prevent the implantation of the second conductivity type impurities in specific portions in the formation region, followed by allowing the implanted impurities to diffuse into the specific portions in the horizontal direction of the substrate by thermal treatment in the latter process, thereby, obtaining the slit portions. Another method involves implanting the second conductivity type impurities in the formation region of the tub followed by selectively implanting the first conductivity type impurities by use of a photoresist mask on the appropriate portion, thereby lowering the second conductivity type concentration.

The semiconductor device according to the present invention comprises a gate oxide film, a gate electrode, an interlayer insulating film and a source/drain electrode. These elements are not particularly restricted to any specific type as long as they can be used for normal purposes. They can be formed of known material by the known method.

Furthermore, in accordance with the present invention, a tub that can serve as a second impurity diffusion layer can be simultaneously formed together with a low voltage operating MOS transistor when the low voltage operating MOS transistor as well as the high dielectric strength MOS transistor are formed on the same semiconductor substrate. In such case, the drift layer can be formed together with the inversion preventing diffusion layer that can be introduced below the device isolation layer in the MOS transistor region.

An embodiment of the semiconductor device according to the present invention will be illustrated in conjunction with the drawings.

EMBODIMENT 1

Figure 1:
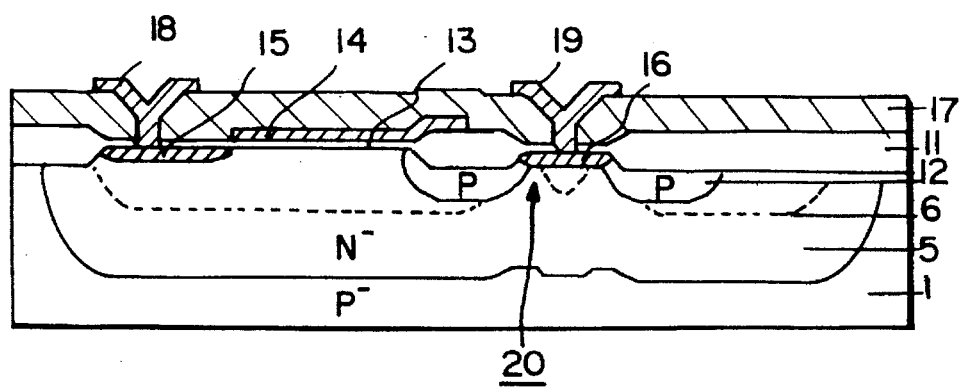
FIG. 1 is a schematic sectional view of an essential portion illustrating one embodiment of a semiconductor device according to the present invention.

FIG. 1 shows a general construction of the semiconductor device. Namely, referring to FIG. 1, a p-type silicon substrate 1 is used as a semiconductor substrate. On the silicon substrate 1 is formed a select oxide film 11 comprising SiO$_2$ to define an active region. On this active region is formed a gate oxide film 13 comprising SiO$_2$ on which is further formed a gate electrode 14 formed of polysilicon.

In addition, in the silicon substrate 1 is formed a tub 5 serving as a n$^-$-type impurity diffusion layer. Within this tub and below the select oxide film 11 is formed a drift layer 12 serving as a p-type impurity diffusion layer. Further on the surface of the silicon substrate 1 are respectively formed source/drain regions 15 and 16. The drain region 16 is formed so as to connect to the drift layer 12. In the neighborhood of the portion where the drain region 16 and the drift layer 12 are connected, slit portion 20 is formed which serves as a low concentration region of the tub 5. Incidentally, Reference Numeral 6 designates an isoline connecting the points of the same impurity concentration inside the tub 5. In addition on the silicon substrate 1 including the gate electrode 14 is laminated a CVD $SiO_2$ film 17. On the CVD $SiO_2$ film is formed a contact hole extending through to the source/drain regions 15 and 16. On the source/drain regions 15 and 16 respectively connected to the source electrode 18 and the drain electrode 19 are formed.

Figure 6:
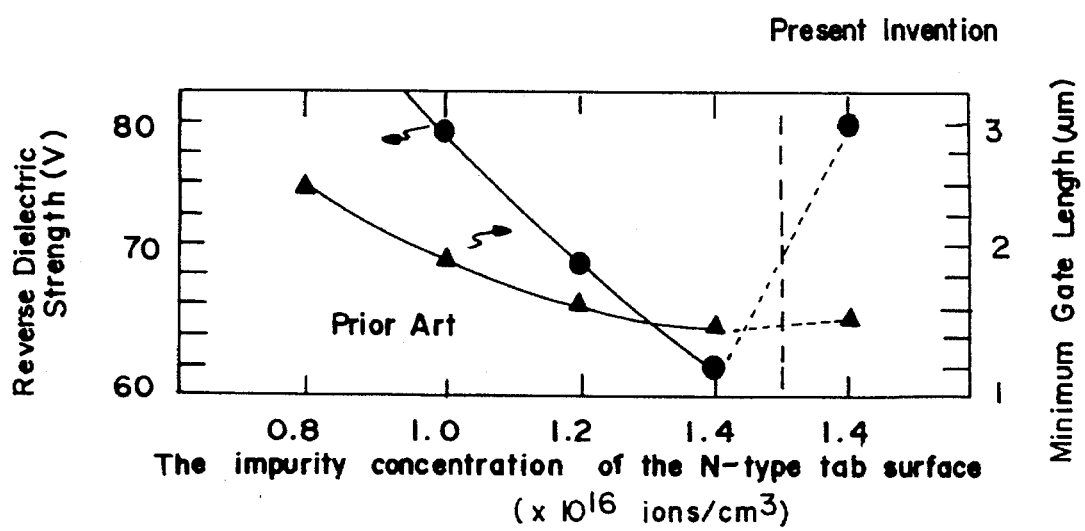
FIG. 6 illustrates the impurity concentration dependency of the tub with respect to the reverse dielectric strength and the minimum gate length that does not generate the punch-through of the semiconductor device according to the prior art and the present invention.
Figure 7:
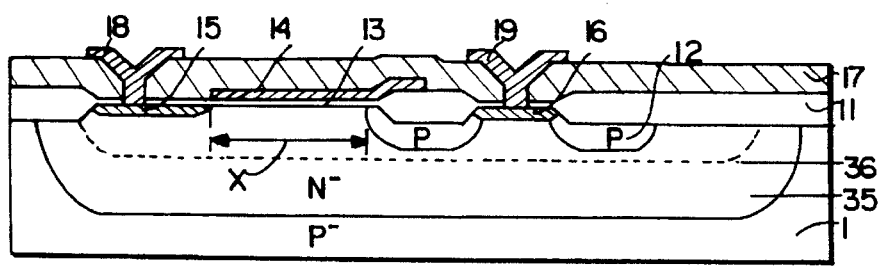
FIG. 7 is a schematic sectional view of an essential portion illustrating a conventional semiconductor device.

In the semiconductor device thus formed, the minimum gate length is small assuming only about 1.5 μm as shown in FIG. 6. The reverse dielectric Strength is quite favorable assuming 80 V.

Figure 3A:
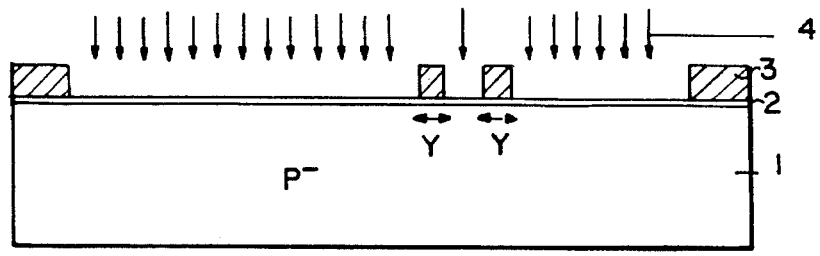
FIGS. 3(a) to (e) illustrate a process for manufacturing the semiconductor device according to the present invention.
Figure 3B:
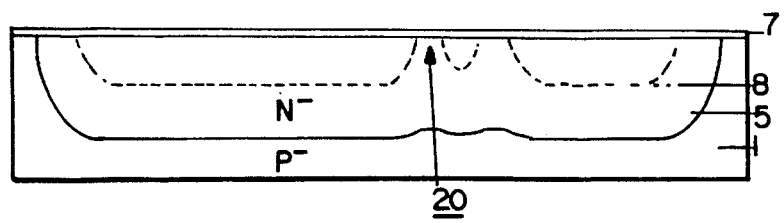
Figure 3C:
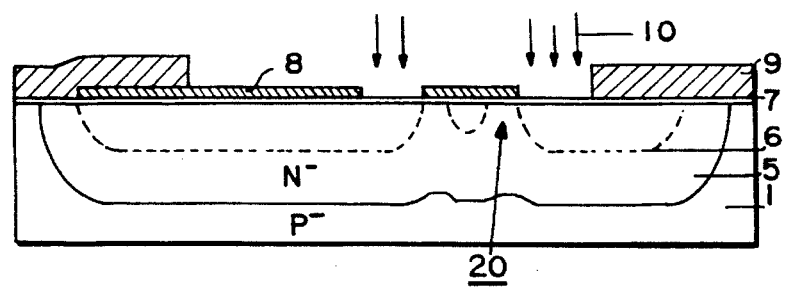
Figure 3D:
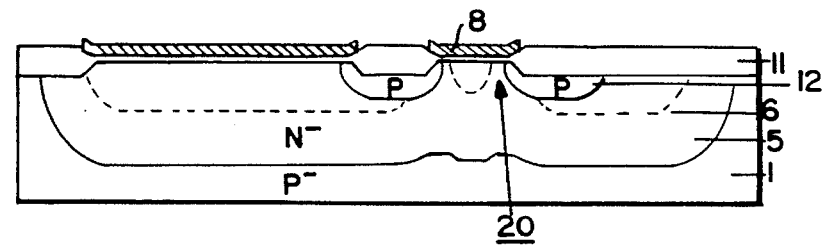
Figure 3E:
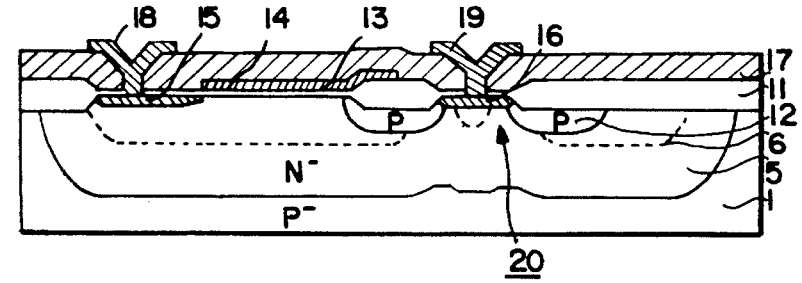
Figure 4A:
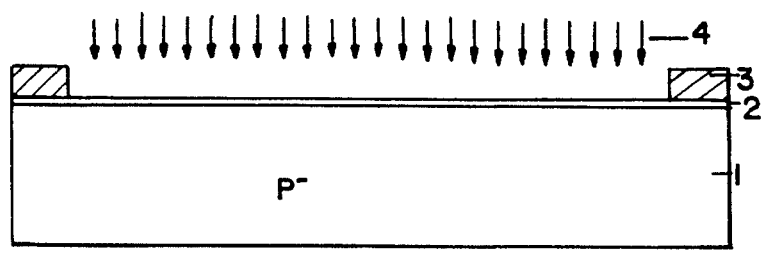
FIGS. 4(a) to (c) illustrate another process for manufacturing the semiconductor device according to the present invention.
Figure 4B:
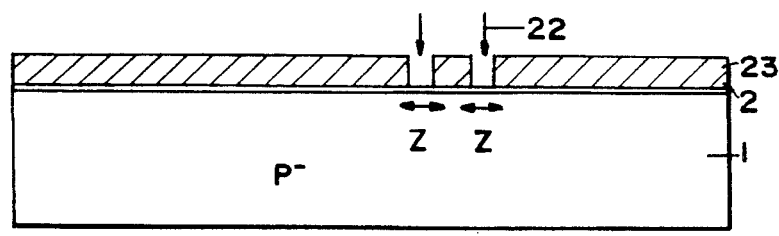

A method for manufacturing a semiconductor device thus formed will be illustrated in conjunction with FIGS. 3 and 4.

FIG. 3 shows a method for implanting the n-type impurities by the use of a photoresist mask for the formation of the region of the tub 5 in order to prevent the implantation of the n-type impurities to specific portions in the formation region, followed by allowing the implanted n-type impurities to diffuse to the slit portions 20 in the horizontal direction of the substrate by thermal treatment in the latter process, thereby obtaining the slit portions.

As shown in FIG. 3 (a), on a p-type silicon substrate 1 having a specific resistance of 10 Ωcm, about 50 nm thick thermal oxide silicon film 2 is grown. Subsequently, phosphorus 4 is selectively implanted into the silicon substrate 1 in a concentration of $7\times10^{12}$ ions/cm$^2$ through the use of a photoresist mask patterned to about 3 μm in width Y in desired configuration.

Then as shown in FIG. 3 (b), the resist mask 3 is removed. In the atmosphere of $N_2$ at about 1150° C., 2000 minutes thermal diffusion forms the tub 5 which serves as the n-type impurity diffusion layer having a junction depth of about 7 μm and a surface impurity concentration of $1.4\times10^{16}$ ions/cm$^3$. In this process, at a portion where the implantation of phosphorus is prevented, slit portion 20 which is converted to n-type in a surface impurity concentration of $8\times10^{15}$ ions/cm$^3$ is formed by the lateral diffusion of the n-type impurity. Then after removing the thermal oxide silicon film 2, an about 30 nm thick thermal oxide silicon film 7 is formed.

Furthermore, as shown in FIG. 3 (C), about 120 nm thick nitride silicon film 8 is formed, and the nitride silicon film 8 for a device isolation region is selectively removed through use of a photoresist mask (not shown). Later, using of the nitride silicon film 8 patterned to a desired configuration and photoresist mask 9, boron 10 is selectively implanted to the silicon substrate 1 in concentration of $8\times10^{13}$ ions/cm$^2$. In this process, boron 10 is implanted at low energy that does not penetrate the nitride silicon film 8, for example, at 15 KeV.

Subsequently, as shown in FIG. 3(d), after removing the photoresist mask 9, about 900 nm thick select oxide film 11 is formed by 200 minutes thermal oxidation at 1050° C. in the presence of $H_2O$. In addition, along with the growth of the select oxide film 11, a drift layer 12 that constitutes a p-type impurities diffusion layer having a junction depth of approximately 0.8 μm is formed below part of the select oxide film 11.

Then, as shown in FIG. 3(e), the nitride silicon film 8 is removed followed by removing the thermal oxide silicon film 7 in a portion other than the select oxide film 11 are grown. Then about 120 nm thick gate oxide film 13 is formed at a portion where the thermal oxide silicon film 7 is removed. Then on the gate oxide film 13 is formed a gate electrode 14 to a thickness of about 400 nm of polysilicon. Later $5\times10^{15}$ ions/cm$^2$ of boron is implanted into the silicon substrate 11 through use of the gate electrode 14 and the select oxide film 11 as a mask thereby forming a source/drain regions 15 and 16 that constitutes a p-type impurity diffusion layer. In this process, the drain region 16 is formed between the drift layers 12 formed in the previous process. At the same time, slit portions are arranged in the neighborhood of a portion where the drain region 16 and the drift layer 12 are connected with each other. Then, on the silicon substrate 1 including the gate electrode 14, about 800nm thick CVD oxide silicon film 17 is formed. Subsequently, on the CVD oxide silicon film 17 on the source/drain regions 15 and 16, a contact hole is formed that extends over to the silicon substrate 1. Then the source electrode 18 and the drain electrode 19 are formed by depositing, for example, Al to a thickness of about 1000 nm and patterning it to a desired configuration.

FIG. 4 shows a method for lowering the n-type impurity concentration by selectively implanting the p-type impurity through the use of a photoresist mask in a region which constitutes slit portions 20 after the n-type impurity is implanted into the entire surface of the region where the tub 5 is formed.

At the outset, as shown in FIG. 4(a), on a p-type silicon substrate 1 having a specific resistance of 10 Ωcm about 50 nm thick thermal oxide silicon film 2 is formed. Then through the use of the resist mask 3 patterned to a desired configuration phosphorus 4 is selectively implanted into the silicon substrate 1 in a concentration of $7\times10^{12}$ ions/cm$^2$.

Subsequently, after removing the resist mask 3, as shown in FIG. 4 (b), through the use of resist mask 23 having a hole (Z) of about 3 μm, boron 22 is selectively implanted into the silicon substrate 1 in a concentration of $8\times10^{12}$ ions/cm$^2$.

Figure 4C:
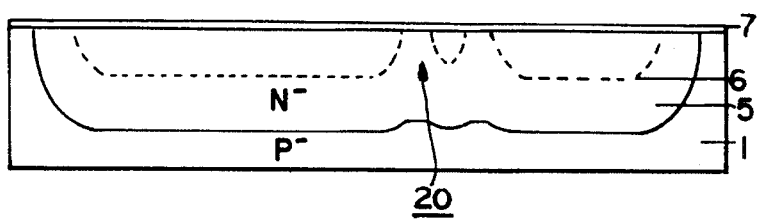

Then after removing the resist mask 3, as shown in FIG. 4(c), in the atmosphere of $N_2$, 2000 minutes thermal treatment forms the tub 5 that constitutes an n-type impurity diffusion with a junction depth of about 7 μm and surface impurity concentration of $1.4\times10^{16}$ ions/cm$^3$. In this process, at a portion where boron is implanted through the resist mask in the process, the slit portions are n-type portions to have an n-type impurity surface concentration of $8\times10^{15}$ ions/cm$^3$. Then after the thermal oxide silicon film 2 is removed, about 30 nm thick thermal oxide silicon film 7 is newly formed.

The following process will be performed in the same manner as described in FIGS. 3(c) through 3(e).

EMBODIMENT 2

Figure 2:
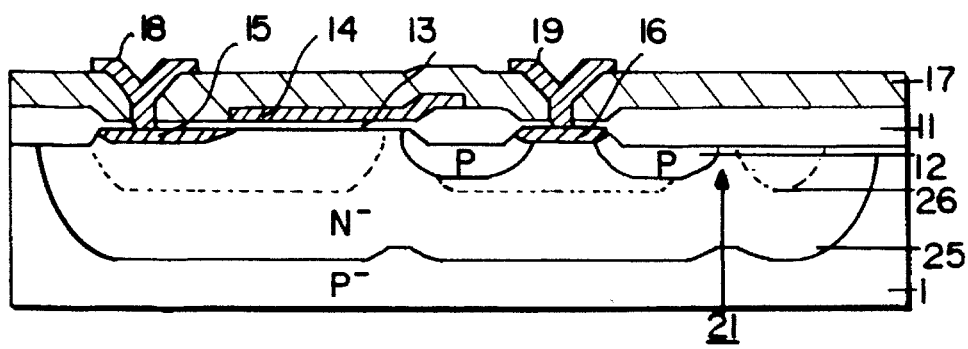
FIG. 2 is a schematic sectional view of an essential portion illustrating another embodiment of the semiconductor device according to the present invention.

FIG. 2 shows Embodiment 2 of the semiconductor device according to the present invention. Referring to FIG. 2, Embodiment 2 of the semiconductor device is formed in the same manner as Embodiment 1 except that slit portions 21 which constitute a low concentration in the tub 25 formed in the silicon substrate 1 is formed in the neighborhood of the drift layer 12 and opposite to the portion where the drift layer 12 and the drain region 16 are connected with each other.

Incidentally, with respect to Embodiment 2 of the semiconductor device, the process for manufacturing the semiconductor device can be formed substantially in the same manner as Embodiment 1 except that the pattern of the resist mask 3 used in selectively implanting phosphorus 4 into the silicon substrate 1 is converted so that slit portions are formed in and on slit portions 21 on the opposite side to the portion where the drift layer 12 and the drain region 16 are connected with each other.

In the semiconductor device formed in the above manner, the slit portions 20 and 21 are arranged at a strong electric field generating portion where the drift layer 12 that constitutes a p-type impurity diffusion layer and tubs 5 and 25 that constitute a n-type impurity diffusion layer are connected with each other. Consequently, this serves as a means of alleviating the electric field.

Therefore, with respect to the semiconductor device according to the present invention, since the impurity concentration of the second conductivity type tub has a slit portion which is partially low in the neighborhood of the first conductivity type drift layer, the electric field generated between the drift layer and the second conductivity type tub is alleviated, thereby raising the reverse dielectric strength.

Furthermore, by partially reducing the concentration of the second conductivity type tub in accordance with implanting the first conductivity type impurities to the specific regions, the impurity diffusion layer (tub) other than the specific region (the slit portion) can be provided with the absolutely high impurity concentration, thereby enabling, the inhibition of the punch-through between the source and drain. Consequently, the gate length can be set to a small scale. Therefore, it is suitable for the refinement of the semiconductor device.

In addition, when a low-voltage operating transistor is formed on the same substrate, the tub can be formed at the same time.

While the present invention has been shown and described with respect to the above preferred embodiments, it will be apparent to one skilled in the art that modifications can be made without departing from the spirit and scope of the following claims.

What is claimed is:

1. A semiconductor device including a high voltage MOS transistor comprising:

a first conductivity type semiconductor substrate having an upper surface;

a second conductivity type tub formed in the first conductivity type semiconductor substrate, said tub extending to said upper surface, said tub including a portion at an upper surface of said tub, said portion having a second conductivity impurity concentration;

at least one predetermined slit region formed within and surrounded laterally by said portion, said at least one predetermined slit region having a lower second conductivity type impurity concentration than the second conductivity type impurity concentration of said portion;

first conductivity type source/drain regions within and surrounded by said portion formed in said tub and extending from said upper surface; and at least one of said first conductivity type source/drain regions having a first conductivity type drift layer connected thereto, said first conductivity type drift layer extending toward the other of said first conductivity type source/drain regions;

wherein said at least one predetermined slit region contacts at least said drift layer from said portion to thereby increase the reverse breakdown voltage of said transistor.

2. A semiconductor device of claim 1, in which the at least one slit region is formed in the vicinity of the connecting portion between the said one source/drain region and the drift layer.

3. A semiconductor device of claim 1, in which the at least one slit region is formed in the vicinity of the drift layer end opposite to the drift layer end connected to said one source/drain region.

4. A semiconductor device of claim 1, in which the impurity concentration of the second conductive type tub is in the range of about $1 \times 10^{16}$ to $3 \times 10^{16}$ ions/cm$^3$ on the surface of the substrate, and the impurity concentration of the at least one slit region is in the range of about $7 \times 10^{15}$ to $9 \times 10^{15}$ ions/cm$^3$.

5. A semiconductor device of claim 2, in which the impurity concentration of the drift layer is in the range of about $2 \times 10^{16}$ to $5 \times 10^{16}$ ions/cm$^3$.

6. A semiconductor device of claim 3, in which the impurity concentration of the drift layer is in the range of about $5 \times 10^{16}$ to $8 \times 10^{16}$ ions/cm$^3$.

7. A semiconductor device as in claim 1, wherein the low impurity concentration of said predetermined slit region is substantially the same as that of an iso line for the second conductivity type impurity concentration within the interior of the tub.

8. A semiconductor device as in claim 1 wherein the drift layer is formed under a thick oxide film.

9. A semiconductor device having a high voltage MOS transistor comprising a first conductivity type semiconductor substrate, a portion at the upper surface having a predetermined first conductivity impurity concentration;

second conductivity type source and drain regions formed in said portion;

a second conductivity type drift layer formed in said portion, connected with the second conductivity type drain region and extending toward the source region; and at least one predetermined slit region formed within and surrounded laterally by said portion, said at least one predetermined slit region having a lower first conductivity type impurity concentration then the first conductivity type impurity concentration of said portion;

wherein said at least one predetermined slit region contacts at least said drift layer to at least partially separate said drift layer from said portion to thereby increase the reverse breakdown voltage of said transistor.

* * * * *